(12) United States Patent
Chen et al.

(10) Patent No.: US 9,169,822 B2
(45) Date of Patent: Oct. 27, 2015

(54) DEEP OCEAN CURRENT POWER PLANT AND CONSTRUCTING PROCEDURE THEREOF

(71) Applicant: NATIONAL TAIWAN UNIVERSITY, Taipei (TW)

(72) Inventors: Falin Chen, Taipei (TW); Si-Chen Lee, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 65 days.

(21) Appl. No.: 14/085,556

(22) Filed: Nov. 20, 2013

(65) Prior Publication Data
US 2014/0077503 A1 Mar. 20, 2014

Related U.S. Application Data

(63) Continuation-in-part of application No. 13/274,021, filed on Oct. 14, 2011, now abandoned.

(30) Foreign Application Priority Data

Jun. 15, 2011 (TW) .............................. 100120817 A (51) Int. Cl.
*F03B 13/00* (2006.01)
*H02P 9/04* (2006.01)
*F03B 13/10* (2006.01)
*E02B 9/00* (2006.01)
*F03B 17/06* (2006.01)
*H02J 3/38* (2006.01)

(52) U.S. Cl.
CPC . *F03B 13/10* (2013.01); *E02B 9/00* (2013.01); *F03B 17/061* (2013.01); *F05B 2240/40* (2013.01); *F05B 2240/917* (2013.01); *F05B 2240/95* (2013.01); *F05B 2240/97* (2013.01); *H02J 3/382* (2013.01); *Y02E 10/22* (2013.01); *Y02E 10/28* (2013.01)

(58) Field of Classification Search
CPC .......... F03B 13/10; F03B 17/061; E02B 9/00; Y02E 10/28; Y02E 10/22; F05B 2240/40; F05B 2240/95; F05B 2240/917; F05B 2240/97; H02J 3/382
USPC ................................. 290/54, 42, 53; 405/224
See application file for complete search history.

(56) References Cited

U.S. PATENT DOCUMENTS

| | | | |
|---|---|---|---|
| 4,851,704 A * | 7/1989 | Rubi | 290/53 |
| 7,902,687 B2 * | 3/2011 | Sauer et al. | 290/54 |
| 2011/0241347 A1 * | 10/2011 | Boureau et al. | 290/53 |

* cited by examiner

*Primary Examiner* — Javaid Nasri
(74) *Attorney, Agent, or Firm* — Tim Tingkang Xia, Esq.; Locke Lord LLP (57) ABSTRACT

The invention provides a deep ocean current power plant. In one embodiment, the deep ocean current power plant comprises at least one relay platform, a plurality of platform anchorage cables, a plurality of turbine generators, and power conversion equipment. The at least one relay platform floats and is submerged in a deep ocean current. The platform anchorage cables anchor the relay platform to a seabed. The turbine generators are anchored to the relay platform, and convert kinetic energy of the deep ocean current into electrical energy. The power conversion equipment is installed on the relay platform, gathers the electrical energy generated by the turbine generators to generate an electrical power, and modulates the electrical power to be transmitted to a land power station.

15 Claims, 9 Drawing Sheets

DEEP OCEAN CURRENT POWER PLANT AND CONSTRUCTING PROCEDURE THEREOF

RELATED U.S. APPLICATION DATA

The present invention is a continuation-in-part (CIP) of the application "Deep ocean current power plant and constructing procedure thereof" with application Ser. No. 13/274,021, filed on Oct. 14, 2011.

FIELD OF THE INVENTION

The present invention is a deep ocean current power plant and constructing procedure thereof Specifically, the invention is used in ocean with depth of more than 40meters, and it is able to convert kinetic energy generated from ocean current into electrical energy.

BACKGROUND OF THE INVENTION

Currently, there is no precedent of building a deep ocean current power plant in the world, but there are many testing turbines designed for tidal power plants in shallow sea of which the depth is within 20 meters. For example, the company, Seagen & Seaflow based in UK, set up a single turbine of 300 kW named SeaFlow in Lynmouth, on the North Devon Coast of the United Kingdom on May 2003 (refer to Kuroshio power plant development plan. Renewable and Sustainable Energy Reviews 14 (2010) 2655-2668). In 2008, Strangford Lough of Northern Ireland successfully set up a dual turbine of 1.2 MW named SeaGen (refer to Kuroshio power plant development plan. Renewable and Sustainable Energy Reviews 14 (2010) 2655-2668). The generator which is running approximately 18-20 h/day has a link to the local power grid.

Recently, a demonstrative power plant with a power capacity of 20-25 kW located on the coast of British Columbia province in Canada, and the Retrofit Bridge Project located in Tacoma City, Wash. state in United States will set up Davis Hydro Turbines under the bridge (refer to Kuroshio power plant development plan. Renewable and Sustainable Energy Reviews 14 (2010) 2655-2668). The above projects are still categorized into tidal power plants in shallow sea.

A deep ocean current power plant is the power project in Gulf Stream belonging to Florida Atlantic University (refer to Kuroshio power plant development plan. Renewable and Sustainable Energy Reviews 14 (2010) 2655-2668). The nature of ocean currents in the two places is similar in the depth which is mostly more than hundreds of meters. However, the present invention uses different power plant structure and techniques.

SUMMARY OF THE INVENTION

The first objective of the present invention is to provide a deep ocean current power plant, applied in sea with depth of more than 40 meters, which is able to convert kinetic energy generated from ocean current into electrical energy.

To achieve the above purpose, the deep ocean current power plant constructed in accordance with one embodiment of the present invention comprises a current generator group, a relay platform, a generator anchorage system, a relay platform anchorage system, and at least one power transmission-and-distribution cable.

The current generator group comprises turbines and generators which convert ocean flow into electrical energy. The functions of the current generator group are broadly divided into two types:
(1) Each of the current generator groups is powered individually, and then the groups are linked in series and/or in parallel to transmit power to the terrestrial network system via the power transmission-and-distribution cable.
(2) Each turbine of the current generator groups drives a hydraulic system in order to drive the generator.

The relay platform comprises the hollow-links which are mounted on a suitable connector to rotate, and then the relay platform is able to adapt the shape for the current interaction.

The generator anchorage system anchors the current generator group firmly above the relay platform.

The relay platform anchorage system anchors the relay platform to the seabed.

The power transmission-and-distribution cable transmits the power generated from the current generator group to an electrical power conversion equipment installed in the relay platform. After using frequency modulation, the power transmission-and-distribution cable is connected to a substation on the land. Thus, a pathway of the cable-lying route shuttles the relay platform and floats in sea instead of the seabed.

The second objective of the present invention is to provide a novel constructing procedure compared with traditional constructing procedure to reduce the cost and the difficulties associated with the construction, and then to increase the engineering reliability and product firmness.

To achieve the purpose mentioned above, the constructing procedure comprises steps of sea-throwing and cable-numbering; assembling a platform and anchoring undersea; anchoring a current generator group; and testing and correcting stability of overall structure.

In contrast with the prior art, following advantages and features of the invention are described.

First, a current generator group mounted undersea is different from the prior art of shallow-sea power plants which are mounted on sea surface. The structure is at the average water depth of tens meters. The real depth required for the construction of the present invention depends on the depth of water and the dispersion of the ocean current. Thus, the current generator group has the following advantages:
 (1) According to the properly designed relay platform and the generator anchorage system in the invention, the structures is able to withstand typhoon with high waves of 10 m.
 (2) Because the current generator group is placed hundreds of meters deep in the water all year round, the possibility for oxidation, corrosion, or biological attachment is less than those for the shallow-sea power plants.
 (3) During the plant construction, the status of marine ecology is in great concern.

The real fact is that the completed power plant of the present invention has little adverse affects on marine ecology.

Second, the relay platform has following advantages:
 (1) It decreases effectively a required length of the generator anchorage system and promotes significantly an anchoring stability and reliability of the power plant of the present invention.
 (2) Anchoring pathways of the relay platform considers the platform's direction via ocean current instead of anchoring to a specific position. The relay platform uses the sea-casting to anchor to the seabed, and thus this approach reduces the difficulty and the cost of the entire construction significantly because the anchor positions are chosen randomly. Furthermore, the relay platform not only reduces but avoids slumping or slipping of the seabed caused by earthquakes to affect the stability of the relay platform.

(3) Because the volume of the cables required for the present invention is large, all the cables are made of composite materials or polymer compounds so as to reduce the total weight of the cables. The cables possess advantages in weight, strength, and toughness. In the mean time, the cables have hairy-tail fibers at downstream reduce the high-frequency vibration on the cables caused by ocean current.

(4) The power transmission-and-distribution cable is mounted on the relay platform instead of touching the seabed, linked to another relay platform, and finally connected to a land substation. Consequently, the above steps reduce total length of cables, avoid scattering cables on the seabed, and eliminate broken cables caused by geological change after completing the power plant construction.

Third, the advantages of the invention of the plant construction herein compared with conventional shallow-sea power plants' are:

(1) Sea-cast anchoring and cable-numbering: It does not require positioning in advance or constructing on a fixed position afterwards.

(2) Platform assembling and undersea anchoring: Most works are completed on sea surface or on land. Little works need to be done undersea. Therefore, the cost is relatively low and the construction is uncomplicated due to its simple structure.

(3) Current generator group anchoring: Same as stated in paragraph (2). Most of the works are completed on sea surface or on land. Little works need to be done undersea. Therefore, the cost is relatively low and the plant is easy to construct.

(4) Testing and correcting the stability of whole structure: It is a mature, standardized technology for testing and correcting the techniques and procedures. As a result, the cost is low and it is relatively simple to carry out. In summary, the stated constructing process will ease both difficulties and cost in the construction as well as improve the engineering reliability and finished work's stability.

As a whole, the above constructing procedure not only reduces the difficult of the construction, but also increases the reliability of the engineering and the stability of overall structure.

DETAILED DESCRIPTION OF THE PRESENT INVENTION

Hereinafter, embodiments of the present invention will now be described in greater detail with reference to the accompanying drawings.

Figure 1:
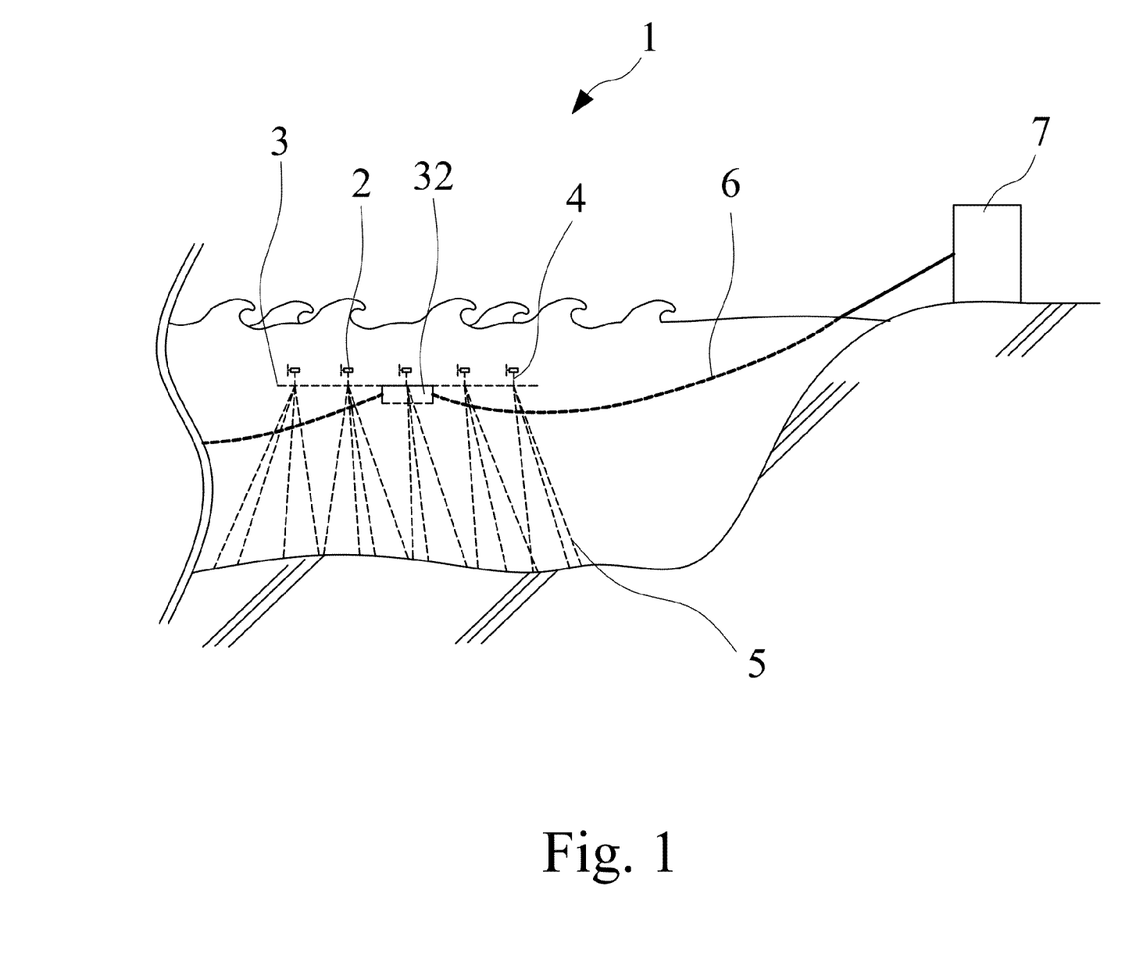
FIG. 1 is a side view of a better embodiment of a deep ocean current power plant in accordance with the present invention.
Figure 2:
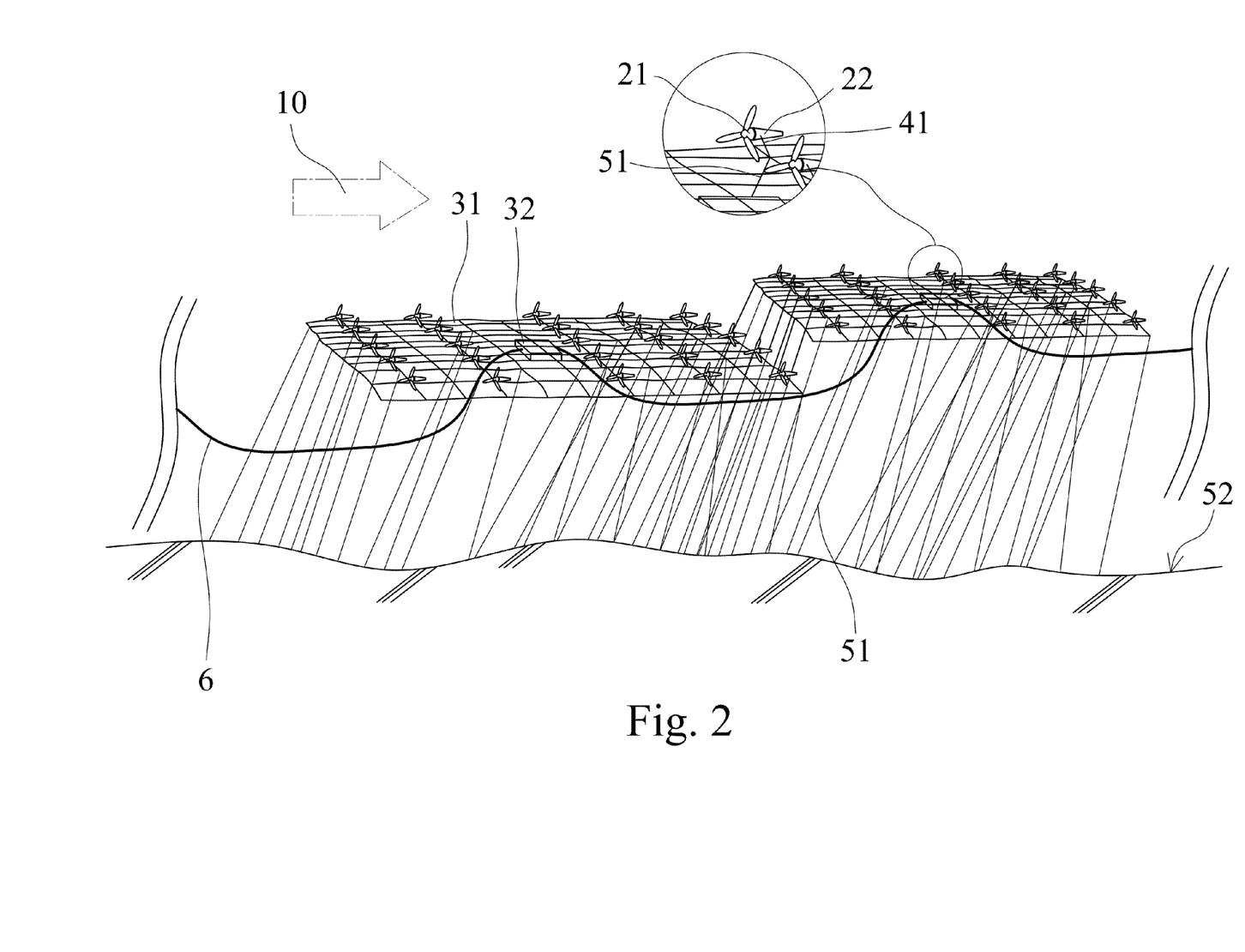
FIG. 2 is a block diagram of a better embodiment of a deep ocean current power plant in accordance with the present invention.

With reference to FIGS. 1 and 2, a better embodiment of a deep ocean current power plant (1) in accordance with the present invention is constructed in a sea with depth of more than 40 meters, such as the Kuroshio current in the eastern coast of Taiwan, in order to convert kinetic energy generated from ocean current into electrical energy. The deep ocean current power plant (1) comprises a current generator group (2), a relay platform (3), a generator anchorage system (4), a relay platform anchorage system (5), and at least one power transmission-and-distribution cable (6).

The current generator group (2), converting the ocean current into electrical energy, comprises at least one turbine (21) and one generator (22) respectively. The generator is driven by the turbine (21). The turbine (21) is either of a horizontal-axis or a vertical-axis turbine (21), and consists of a rotary machine with two to five blades. A casing for the turbine (21) needs to be built around the machine in order to increase energy conversion efficiency. Trunk parts of the turbine (21), such as the bearing and frame, which are more likely to be worn and function as the force body, shall be made of special alloys. Other components of the turbine (21) are made of composite materials. The generator (22) is driven by the turbine (21) or by a hydraulic system. The generator (22) is of low speed and high-torque, which leads to be of small radius and a long axis. The current generator group (2) will be long-term disposed in a deep-sea and, as a result, the possibility of oxidation corrosion is less than the ones in shallow waters. However, there are still possibilities having marine creatures clinging to the apparatus, which can be prevented by developing new eco-friendly coating materials. In addition, some metal components require processing with either electroplating or lubrication to prolong the lifespan of the metal components in the sea. The number of the current generator group (2) is better to be arranged in the range from 20 to 30.

The relay platform (3) comprises a plurality of hollow-links (31). An electrical power conversion equipment (32) is installed at the hollow-links (31). The relay platform (3) comprises the hollow links (31) mounted with a suitable connector (ex. ball-shaped connector). The relay platform (3) would be randomly deformed in low-frequency vibration by the external force, coming from the ocean current, the turbine's (21) tension, or the tension between the relay platform (3) and the seabed (52). The hollow-links (31) are preferably made of composite materials or plastic-steel materials. The relay platform (3) is arranged at a suitable depth level undersea, and the dimension of the platform is varied in accordance to the size of the power plant.

The generator anchorage system (4) anchors the current generator group (2) on and above the relay platform (3). The generator anchorage system (4) includes anchoring cables (41), which are made of polymer compounds or light-weight and of high-strength composite materials. Hairy-tail fibers can be affixed along the anchoring cables (41) at downstream to reduce the low frequency swing or the high-frequency vibration on the anchoring cables (41) caused by ocean current.

The relay platform anchorage system (5) anchors the relay platform (3) to a seabed (52). The relay platform anchorage system (5) comprises a plurality of submarine cables (51), which are made of polymer compounds or light-weight and of high-strength composite materials. Hairy-tail fibers can be affixed along the submarine cables (51) at downstream to reduce the low frequency swing or the high-frequency vibration on the submarine cables (51). Tens or hundreds of the submarine cables (51) are mounted on the seabed (52). It does not require identifying the anchoring positions and locations of the submarine cables beforehand. The directions to extend the submarine cables (51) must take account of the ocean current flow motion, which is the ocean current kinetic energy (10), and the relay platform (3) is able to eliminate possible significant displacement or any large-scale deformation under strong external forces.

Figure 3:
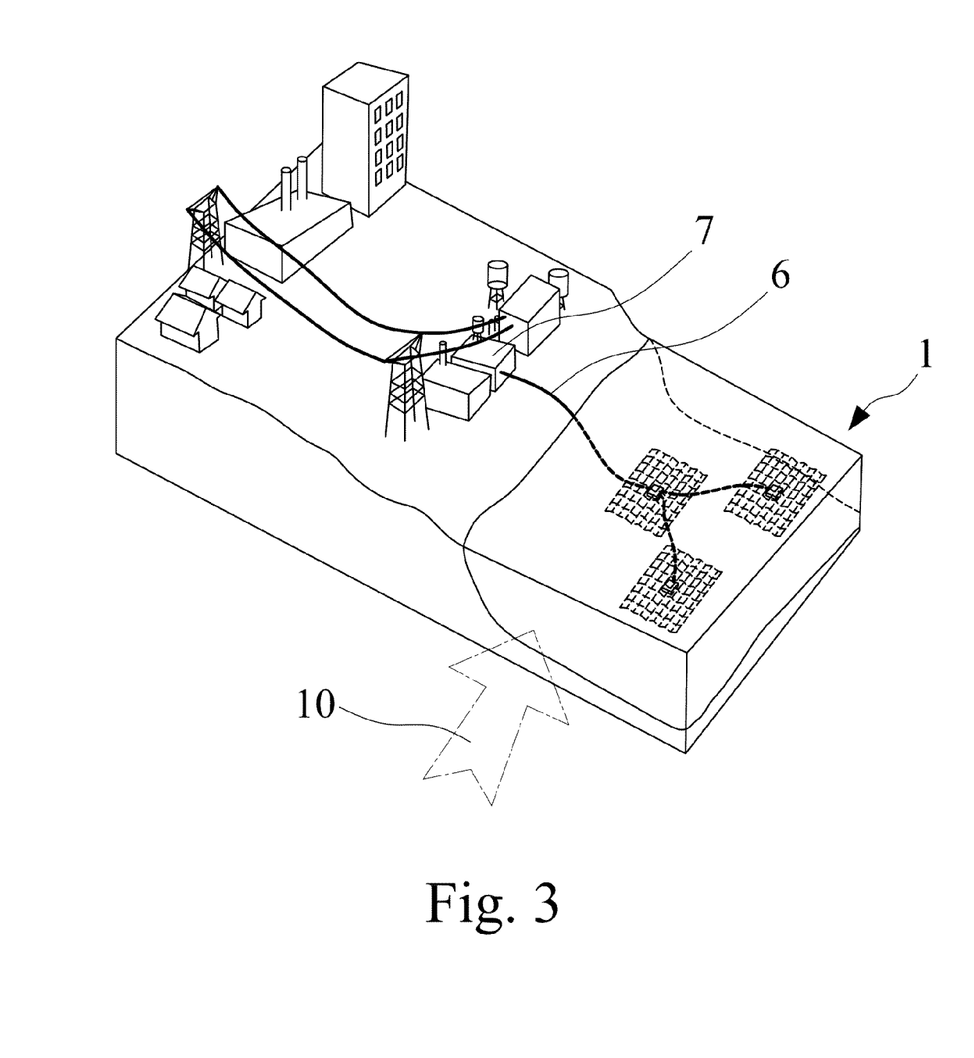
FIG. 3 is a schematic diagram of a better embodiment of a deep ocean current power plant in accordance with the present invention.

At least one power transmission-and-distribution cable (6) transfers power produced by the current generator group (2) to a set of electrical power conversion equipment (32) which is mounted on the relay platform (3). As shown in FIGS. 3, after using frequency modulation, the power is transmitted to a terrestrial network system, such as a land substation (7). The power transmission-and-distribution cables (6) are linked in series and/or in parallel.

Figure 4:
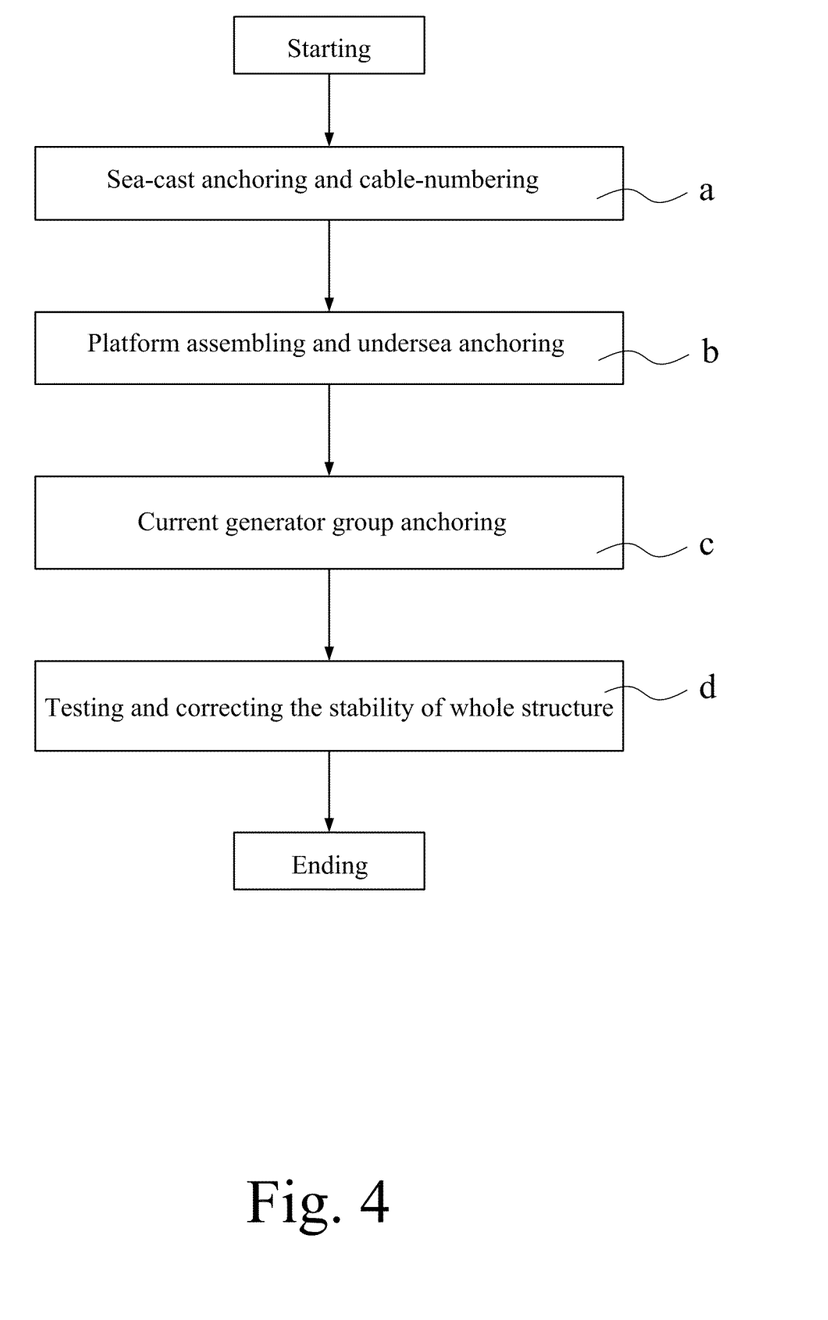
FIG. 4 is a flow chart of a better embodiment of a constructing procedure of the deep ocean current power plant in accordance with the present invention.

As shown in FIGS. 4, a better embodiment of a constructing procedure of the deep ocean current power plant in accordance with the present invention comprises follow steps:

(a) Sea-cast anchoring and cable-numbering:

A relay platform anchorage system (5) comprises a plurality of submarine cables (51) which are numbered in advance. The submarine cables (51) are casted into sea and then are fixed on a seabed (52).

(b) Platform assembling and undersea anchoring:

A relay platform (3) comprises a plurality of hollow-links (31) which are assembled in advance. The relay platform (3) presents a balance between buoyancy and gravity via injecting water into the hollow-links (31). The numbered submarine cables (51) are fixed to the relay platform (3), and then are regulated to let the relay platform (3) sink to a suitable depth level undersea. Subsequently, the water in the hollow-links (31) is removed in order to produce buoyancy. Thus, the relay platform (3) floats stably in the sea because of the buoyancy and a force of the submarine cables (51).

(c) Current generator group anchoring:

A generator anchorage system (4) comprises a plurality of anchoring cables (41). A current generator group (2) anchors to the relay platform (3) via the anchoring cables (41). The current generator group (2) presents a balance between buoyancy and gravity in order to let the current generator group (2) float stably in the sea.

(d) Testing and correcting the stability of whole structure:

Finally, it is to adjust length between the anchoring cables (41) of the generator anchorage system (4) and the submarine cables (51) of the relay platform anchorage system (5), and to adjust strength of buoyancy between the relay platform (3) and the current generator group (2). Thus, above steps let the relay platform (3) and the current generator group (2) set and float stably on the ocean current, and then continue producing power.

Figure 5:
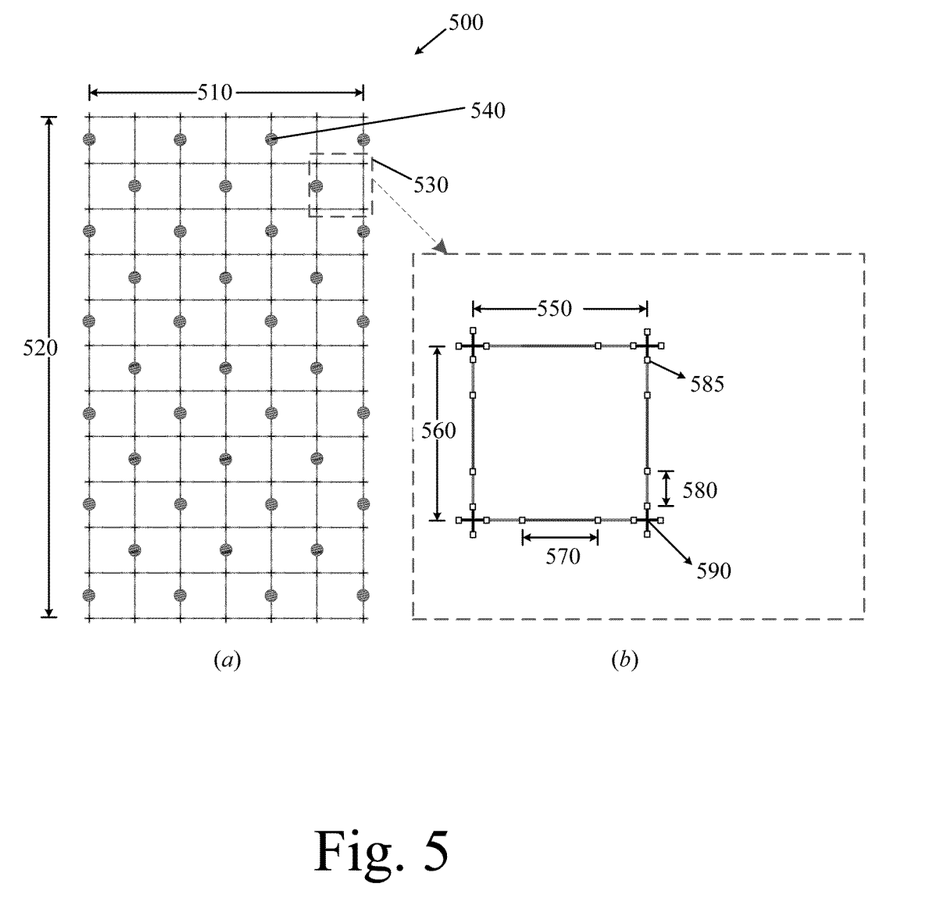
FIG. 5 is a schematic diagram of a relay platform according to the invention.

Referring to FIG. 5, a schematic diagram of a relay platform (500) according to the invention is shown. An assembly for the relay platform (500) made up of 66 individual unit platforms (530) is developed. Each unit platform 530 has a width (550) of 70 m and a length (560) of 70 m, and each side of the unit platform (530) is made up of three components: a primary linkage (570) with a length of 30 m in the middle, an auxiliary linkage (580) with a length of 15 m on each side, and a cross (or a cruciform) joint (590) with a length of 10 m. Two auxiliary linkages (580) and one primary linkage (570) form a framework hollow linkage (550) or (560). The side (520) facing against the ocean current has a width of 11 unit platforms, while the side (510) being parallel with the ocean current is six unit platforms wide, giving the relay platform (500) an overall area of 770 m×420 m. The turbine generators (540) above the platform (500) are arranged in a form of staggered grid, anchored by cables of about 50 m long. Each relay platform (500) is able to support a total of 39 turbines (540).

The design of the relay platform (500) is done with a single purpose in mind that one shall deploy the turbine (540) at a predetermined position in deep water and ensure the turbine (540) to stably operate under the action of the ocean current. With the relay platform (500), dozens of turbines (540) can be deployed as a cluster to simplify the engineering procedure to construct the power plant in deep waters. Besides, the relay platform (500) can also comply with the rationality of construction, operation and maintenance costs. Conceptually, in brief, the relay platform (500) is composed of hundreds of buoyant pontoons connected by universal joints (585). Above the platform (500), there are dozens of turbines (540) anchored stably on the platform (500). Below the platform (500), there are hundreds of cables serve to anchor the platform (500) unto the seabed at a depth of several hundred meters.

To ensure sufficient buoyancy to support the platform (500) in the ocean current, the primary linkage (570) and the auxiliary linkage (580) are made of hollow floats, with dimensions dictated by the size of the platform (500). These floats can be made of composite materials or rust-proof metal. All floats are connected by universal joints (585), giving the platform (500) a flexible structure. The turbine anchor point can be rotated with a hollow sleeve jacketing on the primary linkage (570). This sleeve is installed at the middle of the primary linkage (570) and can move around the primary linkage (570), but its lateral movement along the linkage is prohibited. The platform's cable anchor point is located on the bottom of the cross joint (590), which is connected to the cable by a ball joint. To prevent significant drift in the current, the anchor point of each cross joint (590) is attached to two cables anchored to the seabed, thus restricting displacement of the platform (500).

The universal joint (585) connecting the primary linkage (570) and the auxiliary linkage (580) is the key design focus of the relay platform (500). This universal joint (585) not only controls the deformation of the entire platform, but also absorbs high frequency vibrations caused by the ocean current, thus reducing the risk of damage to the power plant's structure from deformation strain or fatigue. At the same time, both the level of platform deformation and the degree of linkage rotation can be controlled by selecting a proper stiffness of the rotating spring of the universal joint (585).

Figure 6:
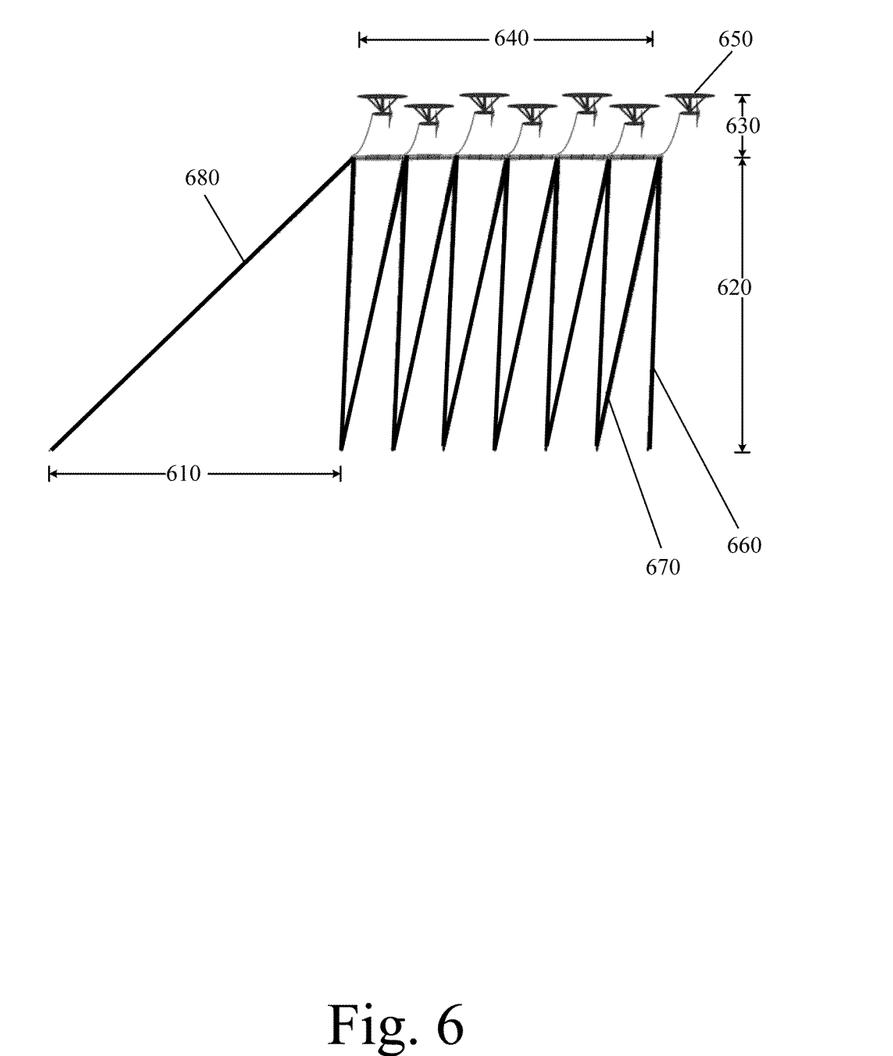
FIG. 6 is a side view of a complete deep ocean power plant according to the invention.

Referring to FIG. 6, a side view of a complete deep ocean power plant (600) according to the invention is shown. A relay platform (640) is used to anchor dozens of horizontal-axis turbines (650). The relay platform (640) consists of hundreds of hollow floats connected by ball joints, being allowed to deform under the dynamical force applied on the turbines (650) by the Kuroshio. To prevent wind-driven big waves from damaging the turbines (650) and the platform (640), the axis of the turbines (650) should be submerged at least 30*m* below the surface, and the platform (640) can be submerged to a depth of up to 70 m.

The relay platform (640) serves as an artificial seabed, raising the level of the actual seabed from hundreds of meters deep. The turbine generator (650) is anchored to the relay platform (640) by a single cable of a length about 20 m to 30 m, allowing the turbine generators (650) to drift with the ocean current within a limited domain. The platform (640) is anchored to the seabed hundreds of meters deep by tens or hundreds of cables (660) and (670), and the direction of the cables (660) and (670) shall be in accordance with the ocean current, so that the whole relay platform (640) will not suffer significant displacement or deformation under the action of the strong current.

The relay platform (640) is secured to the seabed by a plurality of relay platform anchorage cables which are further divided into two sets of cables (vertical cables (660) and inclined cables (670)), and turbine generators (650) anchored to the relay platform (640) with the central axis of the rotors positioned 30 m above the platform (640). One cable (660) drops vertically to restrict the platform's vertical displacement, while the other cable (670) falls diagonally to restrict downstream displacement. The ocean current moves from left to right, with the left-most cable (680) at a 45 degree angle. The turbines (650) are not drawn to scale, and the $2^{nd}$, $4^{th}$ and $6^{th}$ turbines shown in FIG. 6 appear lower to indicate the staggered configuration.

On the center of the relay platform (640), a set of power conversion equipment is deployed, allowing the platform (640) to modulate the power generated by the turbine generators to be transmitted to the land-based grid. To prevent the damage caused by earthquake, the power cable should hang from one platform to the other before finally connecting to power station on land. Without the need to lower the cable to the seabed, the length of the cable can be reduced significantly and the earthquake-caused cable damage can be prevented. The distance between platforms is relevant to the current characteristics and turbine performance. By deploying platforms (640) in different depth, the distance between platforms (640) can be shortened.

The current design of the Kuroshio power plant (600) offers the following advantages:
1. The turbine (650) is anchored to the relay platform (640) by a single cable of a length less than 50 m, and the lateral drift of the turbine (650) is significantly reduced.
2. The relay platform (640) is anchored to the seabed by hundreds of cables (660) and (670). As a result, the position where the cable is anchored is not required to be preciously accurate comparing with the pre-determined one. Moreover, this design also offers significant flexibility in several parameters including anchor type, number of anchors, and angle of cable extension.
3. In a place experiencing frequent earthquakes and undersea landslides which could easily loosen the anchors, the design calls for hundreds of cables (660), (670), and (680), providing sufficient redundancy that allows some unexpected anchoring damages, enhancing the safety and reliability of the power plant (600).
4. The flexible relay platform structure, combined with the features of using a single cable to anchor each turbine, allows the overall power plant structure to effectively eliminate the high-frequency forces caused by the impact of the current, significantly reducing the likelihood of component fatigue and damage.
5. The design of the relay platform (640) ensures the accurate positioning of the turbines (650) in deep water, increasing the reliability of the power plant engineering. It also eliminate the need of anchoring the turbine (650) directly in the seabed, which reduces overall costs for construction, operations and maintenance, and increases the power plant's life span as well.

Figure 7:
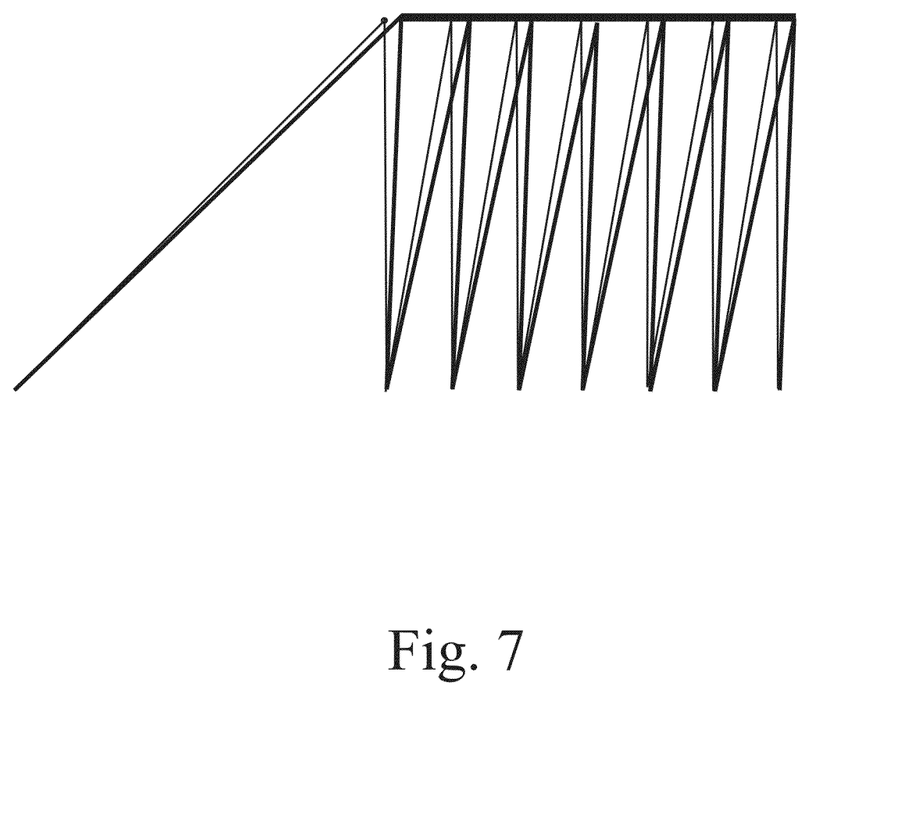
FIG. 7 is a schematic diagram of the side view of cable arrangement of relay platform displacement under the action of ocean current.

Referring to FIG. 7, a schematic diagram of the side view of cable arrangement of relay platform displacement under the action of the ocean current is shown. A dotted line represents the platform and cable position prior to deformation. For the platform under the action of ocean current of speed 1.4 m/s, the horizontal displacement is 17.53 m to the downstream and the vertical displacement is 2.50 m below the original position.

Figure 8:
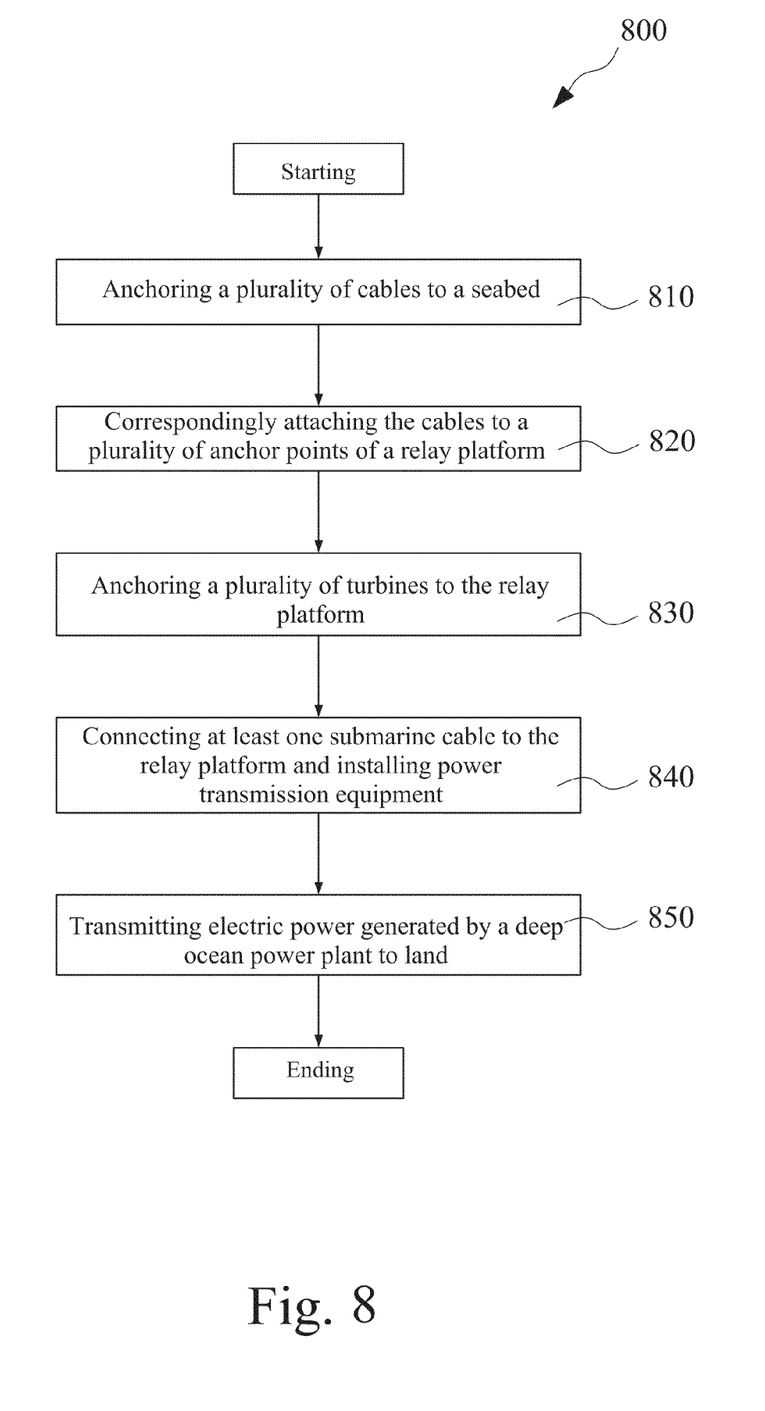
FIG. 8 is a flowchart of a method for constructing a deep ocean power plant according to the invention.

Referring to FIG. 8, a flowchart of a method (800) for constructing a deep ocean power plant according to the invention is shown. Construction engineering for the deep ocean power plant is divided into four major stages: anchoring the platform, deploying the turbines, laying submarine cables and installing power transmission equipment, and power transmission and distribution on land. The first two tasks are highly complex, but the key challenge lies in the deep ocean engineering required. The last two tasks involve mature undersea technology, and engineers can reference many previous projects, thus we shall focus on the first two stages. The work content of these two tasks is explained in the following.

First, the cables are anchored to the seabed (step 810). The seabed geology may consist of igneous rock covered by several meters of sediment. Combining screw-type anchors with pilings provides a more suitable means of anchoring the cables to the seabed.

In addition, the relay platform is anchored to the sea bed (step 820). Once several hundred cables have been anchored to the sea bed, the cables are attached to their corresponding anchor points on the relay platform. The relay platform initially floats on the surface but, as the cables are attached, it gradually sinks until the relay platform assumes a horizontal attitude at a pre-determined depth. Finally, the tension of each cable is individually adjusted to compensate for the buoyancy of the relay platform, ensuring the relay platform stable positioning.

The turbines are then anchored to the relay platform (step 830). The turbines can only be installed once the relay platform has been erected. Given that the side of the relay platform facing the current is subject to the greatest force of the current, the components of this side require the greatest structural stiffness. Therefore, turbine installation should begin at the upstream side of the platform and gradually shift towards downstream. Once the turbines are fully deployed, the buoyancy and tensile strength of the anchor cable for each turbine needs to be adjusted to ensure the turbine will float at the pre-determined depth and will not swift out of position due to the turbulence in current flow.

A power transmission cable is then laid and power conversion equipment is installed to the relay platform (step 840). Finally, the deep ocean power plant starts to operate and the electric power generated by the deep ocean power plant is transmitted and distributed to a land power station (step 850).

Figure 9:
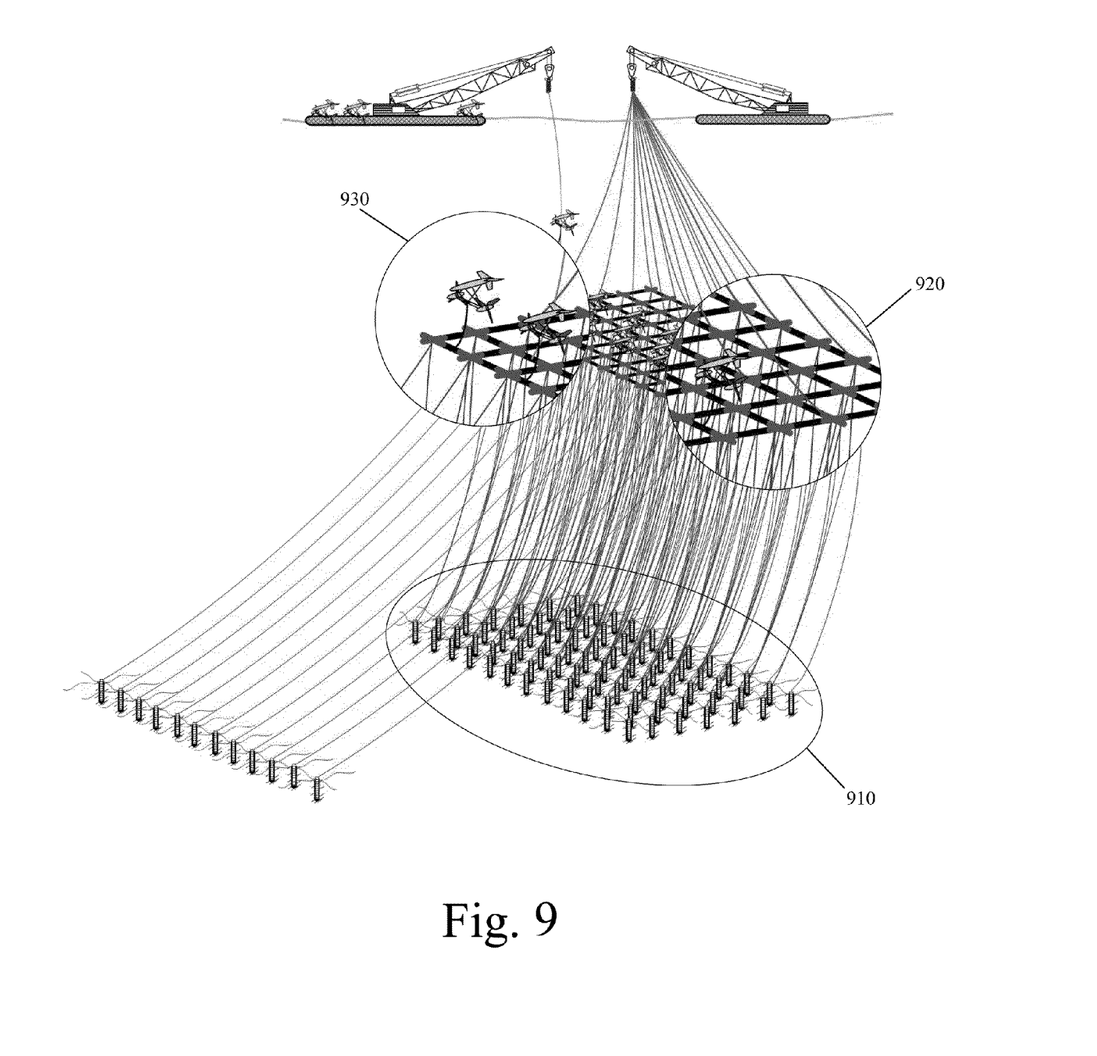
FIG. 9 is a schematic diagram of construction of the deep ocean power plant.

Referring to FIG. 9, a schematic diagram of construction of the deep ocean power plant is shown. The construction procedure is designed to be three steps. First, the cables are anchored to the seabed, as shown by (910). In addition, the platform is anchored in place, as shown by (920). Finally, the turbines are installed on the platform, as shown by (930). Each turbine is anchored to the platform by a single cable, while the platform is anchored to the seabed by two sets of cables: vertical and inclined.

While various embodiments are discussed herein, it will be understood that they are not intended to limit to these embodiments. On the contrary, the presented embodiments are intended to cover alternatives, modifications and equivalents, which may be included within the spirit and scope of the various embodiments. Furthermore, in this Description of Embodiments, numerous specific details are set forth in order to provide a thorough understanding of embodiments of the present subject matter. However, embodiments may be practiced without these specific details. In other instances, well known steps, procedures, components, and circuits have not been described in detail as not to unnecessarily obscure aspects of the described embodiments.

What is claimed is:

1. A deep ocean current power plant, comprising:
   at least one relay platform, submerged in a deep ocean current;
   a plurality of platform anchorage cables, anchoring the relay platform to a seabed;
   a plurality of turbine generators, anchored to the relay platform, located above the relay platform and at least 30 meters (m) under ocean surface, and configured to covert kinetic energy of the deep ocean current into electrical energy; and
   a power conversion equipment, installed on the relay platform, and configured to gather the electrical energy generated by the turbine generators to generate an electrical power, and to modulate the electrical power to be transmitted to a land power station.

2. The deep ocean current power plant of claim 1, wherein each of the turbine generators is anchored to the relay platform via a cable with a length less than 50 m.

3. The deep ocean current power plant of claim 1, wherein the relay platform comprises a plurality of buoyant pontoons connected by a plurality of universal joints.

4. The deep ocean current power plant of claim 1, wherein the platform anchorage cables are divided into a set of inclined cables and a set of vertical cables, and each anchoring point of the relay platform are attached by one of the inclined cables and one of vertical cables, wherein the inclined cables and the vertical cables respectively limit a horizontal displacement and a vertical displacement of the relay platform.

5. The deep ocean current power plant of claim 1, wherein the relay platform is anchored to the seabed by the platform anchorage cables with a depth of hundreds of meters from the seabed.

6. A method for constructing a deep ocean current power plant, comprising:
   anchoring a plurality of platform anchorage cables to a seabed;
   anchoring a relay platform to the seabed by attaching terminals of the platform anchorage cables to the relay platform, such that the relay platform is submerged in a deep ocean current; and
   anchoring a plurality of turbine generators to the relay platform, such that the turbine generators are located above the relay platform and at least 30 meters under ocean surface.

7. The method for constructing a deep ocean current power plant of claim 6, wherein the platform anchorage cables comprise a set of vertical cables and a set of inclined cables, and the step of anchoring of the relay platform to the seabed comprises:
   attaching the set of vertical cables to the relay platform; and
   attaching the set of inclined cables to the relay platform; wherein each of the anchoring points is attached to one of the vertical cables and one of the inclined cables.

8. The method for constructing a deep ocean current power plant of claim 6, wherein the step of anchoring of the turbine generators to the relay platform comprises:
   anchoring each of the turbine generators to the relay platform by a single cable.

9. The method for constructing a deep ocean current power plant of claim 6, further comprises:
   connecting at least one power transmission cable to the relay platform; and
   installing power transmission equipment to the relay platform.

10. A deep ocean current power plant, comprising:
    at least one relay platform, submerged in a deep ocean current, the relay platform comprising a plurality of unit platforms arranged in a plane to form the relay platform, wherein each of the unit platforms comprises:
       a plurality of framework hollow linkages, forming the border of the unit platform;
       a plurality of cross joints, arranged to the locations of the crosspoints of the framework hollow linkages; and
       a plurality of universal joints, connecting the cross joints with the framework linkages;
    a plurality of platform anchorage cables, anchoring the relay platform to a seabed;
    a plurality of turbine generators, anchored to the relay platform, located above the relay platform and at least 30 meters (m) under ocean surface, and configured to convert kinetic energy of the deep ocean current into electrical energy; and
    a power conversion equipment, installed on the relay platform, and configured to gather the electrical energy generated by the turbine generators to generate an electrical power, and to modulate the electrical power to be transmitted to a land power station,
    wherein the platform anchorage cables anchor the unit platforms to a seabed.

11. The deep ocean current power plant of claim 10, wherein each of the framework hollow linkages comprises:
    a primary linkage, acting as a backbone of the framework hollow linkage;
    two auxiliary linkages, with a length less than that of the primary linkage, respectively located at one of the ends of the primary linkage; and
    two universal joints, respectively connecting the auxiliary linkages to the primary linkage.

12. The deep ocean current power plant of claim 11, wherein the plurality of turbine generators are anchored to the framework hollow linkages of the relay platform.

13. The deep ocean current power plant of claim 10, wherein the platform anchorage cables are divided into:
    vertical cables, anchoring the cross joints of the unit platforms to the seabed with a direction vertical to the seabed, limiting a vertical displacement of the unit platforms; and
    inclined cables, anchoring the cross joints of the unit platforms to the seabed with an acute angle from the seabed, limiting a horizontal displacement of the unit platforms,
    wherein each of the cross points of the unit platforms is anchored to the seabed by one of the vertical cables and one of the inclined cables.

14. The deep ocean current power plant of claim 10, wherein the unit platform has a square form and each side of the unit platform is made up of one of the framework hollow linkages.

15. The deep ocean current power plant of claim 14, wherein the relay platform has a rectangular form and comprises 66 unit platforms, wherein one side of the relay platform contains 6 unit platforms and the other side of the relay platform contains 11 unit platforms.

\* \* \* \* \*